(12) United States Patent
Ning et al.

(10) Patent No.: US 10,319,442 B2
(45) Date of Patent: Jun. 11, 2019

(54) PARALLEL-CONNECTED MERGED-FLOATING-GATE NFET-PFET EEPROM CELL AND ARRAY (71) Applicant: International Business Machines Corporation, Armonk, NY (US)

(72) Inventors: Tak Ning, Yorktown Heights, NY (US); Jeng-Bang Yau, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/955,884

(22) Filed: Apr. 18, 2018

(65) Prior Publication Data

US 2019/0130975 A1 May 2, 2019

Related U.S. Application Data (63) Continuation of application No. 15/798,448, filed on Oct. 31, 2017, now Pat. No. 10,049,742.

(51) Int. Cl.
*G11C 16/04* (2006.01)
*H01L 27/11521* (2017.01)
*H01L 27/11526* (2017.01)

(52) U.S. Cl.
CPC ...... *G11C 16/045* (2013.01); *H01L 27/11521* (2013.01); *H01L 27/11526* (2013.01)

(58) Field of Classification Search
CPC .............. G11C 16/045; H01L 27/0922; H01L 27/115–27/11575
See application file for complete search history.

(56) References Cited

U.S. PATENT DOCUMENTS

| 5,604,367 | A | 2/1997 | Yang |
| 7,508,025 | B2 | 3/2009 | Eldridge et al. |
| 7,550,337 | B2 | 6/2009 | Chang et al. |
| 7,700,993 | B2 | 4/2010 | Cai et al. |
| 8,477,539 | B2 | 7/2013 | Chang et al. |
| 8,493,794 | B2 | 7/2013 | Chang et al. |
| 8,705,280 | B2 | 4/2014 | Cai et al. |
| 9,659,655 | B1 * | 5/2017 | Chan .................. H01L 27/1156 |
| 9,704,569 | B1 | 7/2017 | Ning et al. |

OTHER PUBLICATIONS

J. Robertson, "Band offsets of wide-band-gap oxides and implications for future electronic devices." Journal of Vacuum Science & Technology B, vol. 18, No. 3, 2000, pp. 1785-1791.

* cited by examiner

*Primary Examiner* — Daniel P Shook
(74) *Attorney, Agent, or Firm* — L. Jeffrey Kelly, Esq.; Mcginn IP Law Group, PLLC (57) ABSTRACT

A shared floating gate device, the device including an nFET, a pFET including a different material than that of the nFET, and a floating gate.

19 Claims, 7 Drawing Sheets

PARALLEL-CONNECTED MERGED-FLOATING-GATE NFET-PFET EEPROM CELL AND ARRAY

CROSS-REFERENCE TO RELATED APPLICATIONS

The present application is a Continuation Application of U.S. patent application Ser. No. 15/798,448, filed on Oct. 31, 2017, the entire contents of which are hereby incorporated by reference.

BACKGROUND

The present invention relates generally to a shared floating gate device, and more particularly, but not by way of limitation, to a shared floating gate device having a high cell density and a method of manufacture thereof.

A common floating-gate complementary metal-oxide-semiconductor (CMOS) device can function as an electrically erasable programmable read-only memory (EEPROM) device (e.g., a nonvolatile memory storing charges in a floating gate) by using the p-channel field effect transistor (pFET) to avalanche inject hot electrons into a floating gate, and the n-channel field effect transistor (nFET) to avalanche inject hot holes into the floating gate. Hot electrons are electrons in the conduction band that have higher kinetic energy than electrons at thermal equilibrium, and hot holes are holes in the valence band that have higher kinetic energy than holes at thermal equilibrium. Avalanche injection means the hot electrons or hot holes are generated primarily by an avalanche multiplication process.

However, since the conventional techniques use $SiO_2$ as a gate insulator, the energy barrier for injecting electrons into the floating gate is about 3.1 eV and the energy barrier for injecting holes into the floating gate is about 5 eV. That is, a hot electron should have kinetic energy of about 3.1 eV and a hot hole should have kinetic energy of about 5 eV for efficient injection into a floating gate having $SiO_2$ as gate insulator.

Moreover, conventional EEPROM cells and memory arrays employ common-floating-gate series-nFET-pFET devices could have efficient avalanche hot-electron injection in pFET and efficient avalanche hot-hole injection in nFET by using a gate dielectric insulator having low energy barrier for hot electron injection and low energy barrier for hot hole injection. However, these conventional EEPROM cells and arrays have one access transistor for every cell, which takes additional chip area and reduces cell density. Also, common-floating-gate nFET and pFET are connected in series, thereby lacking symmetry in the way the nFET and pFET operate. Further, some conventional structures have parallel connections of nFET and pFET such that these structures are denser than series connection, but still, higher cell density is desired.

SUMMARY

In an exemplary embodiment, the present invention can provide a shared floating gate device, the device including an nFET including an nFET gate dielectric, a pFET including a pFET gate dielectric, and a floating gate, where the nFET and the pFET are connected in parallel and share the floating gate.

Other details and embodiments of the invention will be described below, so that the present contribution to the art can be better appreciated. Nonetheless, the invention is not limited in its application to such details, phraseology, terminology, illustrations and/or arrangements set forth in the description or shown in the drawings. Rather, the invention is capable of embodiments in addition to those described and of being practiced and carried out in various ways that should not be regarded as limiting.

As such, those skilled in the art will appreciate that the conception upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

Aspects of the invention will be better understood from the following detailed description of the exemplary embodiments of the invention with reference to the drawings, in which.

DETAILED DESCRIPTION

The invention will now be described with reference to FIGS. 1-5E, in which like reference numerals refer to like parts throughout. It is emphasized that, according to common practice, the various features of the drawings are not necessarily to scale. On the contrary, the dimensions of the various features can be arbitrarily expanded or reduced for clarity.

Figure 1:
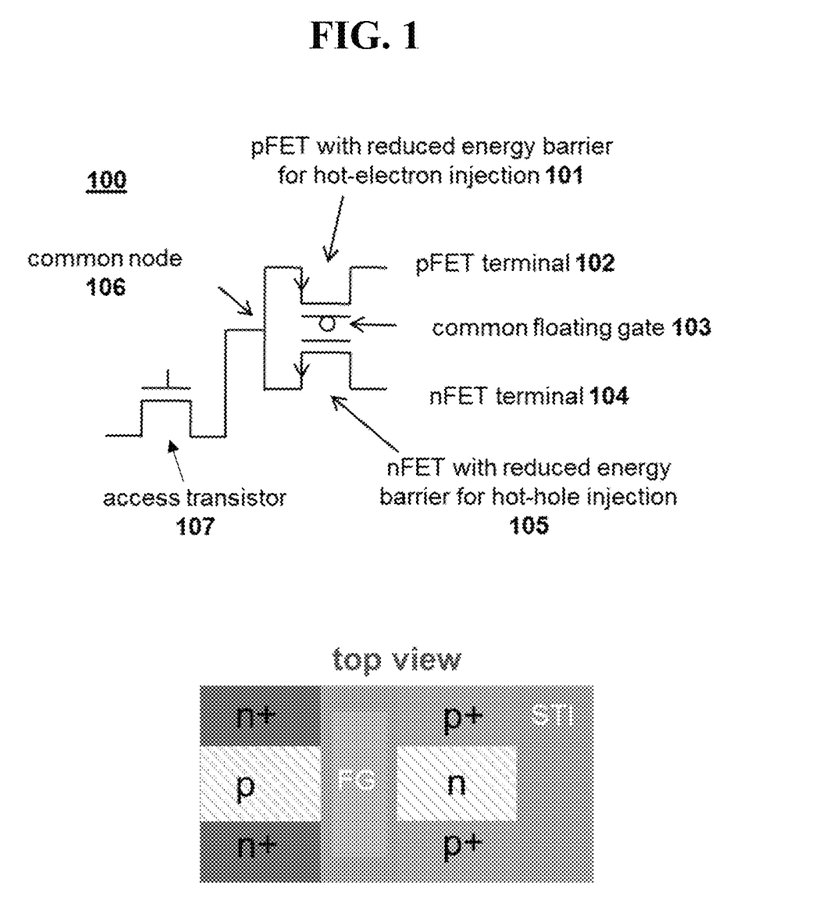
FIG. 1 exemplarily shows a parallel-connected merged-floating-gate nFET-pFET EEPROM cell 100 according to an embodiment of the present invention.

By way of introduction of the exemplarily parallel-connected merged-floating-gate nFET-pFET EEPROM cell 100 depicted in FIG. 1 and the top view thereof the cell 100 includes a pFET with a reduced energy barrier for hot-electron injection 101, a pFET terminal 102, a common floating gate 103, an nFET terminal 104, an nFET with reduced energy barrier for hot-hole injection 105, a common node 106, and an access transistor (i.e., nFET) 107. The drain of pFET 102, the source of nFET 104, and the drain of access transistor 107 are connected together to form the common node 106.

That is, FIG. 1 exemplarily depicts a shared floating gate device including an nFET 104 with an nFET gate dielectric and a pFET 102 with a pFET gate dielectric where the nFET 104 and pFET 102 are connected in parallel and share a common gate 103 which is floating, to form an electrically programmable and erasable non-volatile memory device. Thus, the common floating gate (i.e., made of electrically conducting material) is sandwiched between the nFET and the pFET. The nFET gate dielectric and the pFET dielectric are made of different materials selected so that the difference of the energy barriers for hot-carrier injection formed by the nFET and pFET dielectric is 1 eV or less.

Moreover, the nFET gate dielectric can include, for example, $Y_2O_3$, $ZrO_2$, $HfO_2$, or the like. The pFET gate dielectric can include, for example, $Si_3N_4$, $Y_2O_3$, $ZrO_2$, $HfO_2$, or the like.

The access transistor 107 provides electrical access to the common node 106.

By the exemplarily embodiment depicted in FIG. 1, with a merged floating gate, the cell structure can be smaller than the conventional cell structures. Also, when the access transistor is turned on, a voltage applied to the pFET terminal induces hot-electron injection in the pFET while a voltage applied to the nFET terminal induces hot-hole injection in the nFET. Thereby, efficient hot electron injection in the pFET and efficient hot hole injection in the nFET can be accomplished simultaneously by using high-k gate insulator material such as $Si_3N_4$, $Y_2O_3$, $ZrO_2$, or $HfO_2$. Further, the cell can include a thin interfacial $SiO_2$ layer between device body (silicon) and high-k dielectric. The interfacial SiO2 can be thin, e.g. <1 nm, to allow efficient tunneling of hot carriers through it.

Figure 2:
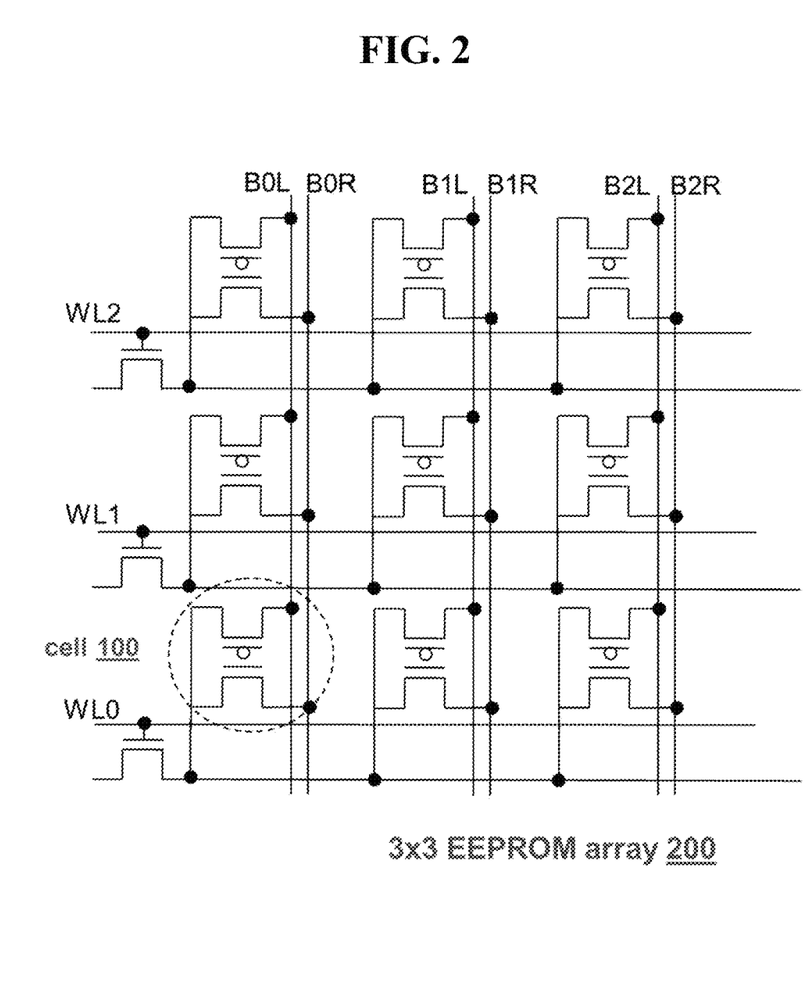
FIG. 2 exemplarily shows an EEPROM array 200 including the cell 100 with one access transistor per wordline according to an embodiment of the present invention.

FIG. 2 exemplarily depicts an EEPROM array 200 (a 3×3 array) including the cell 100 of FIG. 1 described above. The array 200 includes one access transistor per word-line. Each memory cell in an array is connected to one word line and two bit lines (bit line L and bit line R). The cell array 200 can be built using the same standard CMOS logic process used to build logic circuits. Alternatively, the cell array can be built by process that is different or separate from the process used to build logic circuits. For example, the array can be built using SOI (silicon on insulator) or TFT (thin-film transistor) process while the logic circuits are built using standard bulk CMOS process.

Figure 3:
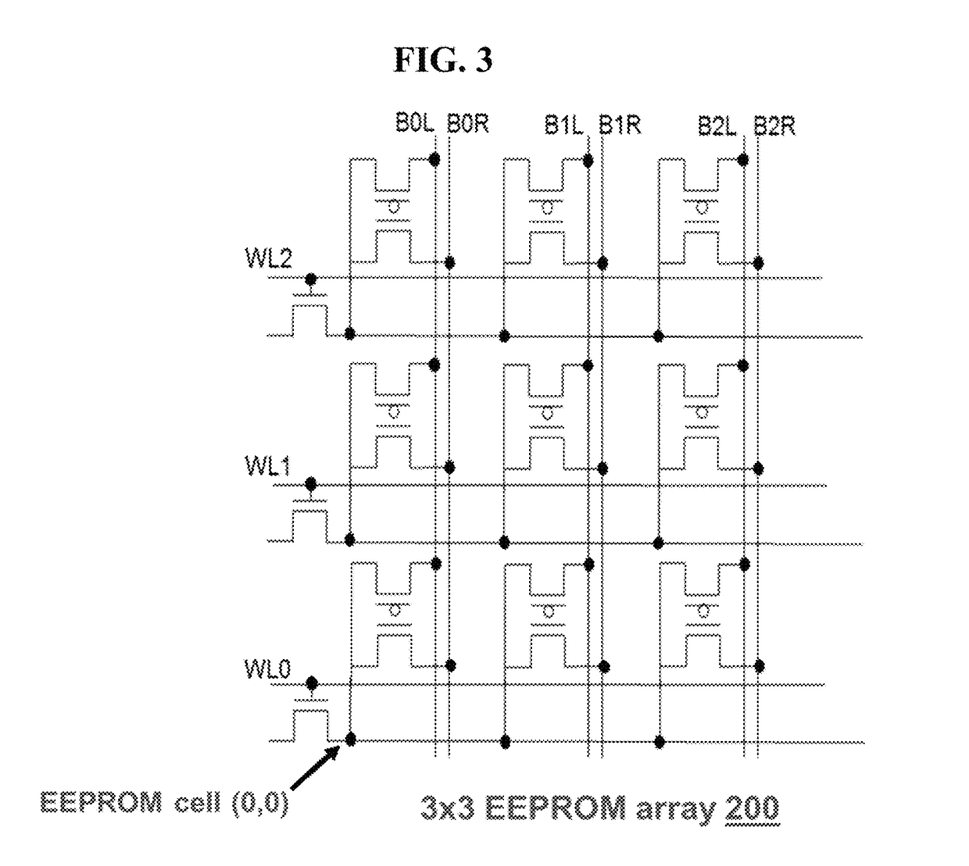
FIG. 3 exemplarily shows an EEPROM array operation of the array 200 with cell (0, 0) using exemplary TABLES 1-2.

FIG. 3 exemplarily depicts the EEPROM array 200 operation (i.e., read/write) with cell (0,0) as an example. (please use the table below, where in Read, both B0L and B0R are applied with 1.5V)

TABLE 1

| For cell (0,0) being selected | | | |
|---|---|---|---|
| | WL0 | B0L | B0R |
| Write "1" | 1.5 V | 0 V | 3.0 V |
| Write "0" | 1.5 V | 3.0 V | 0 V |
| Read | 1.5 V | 1.5 V | 1.5 V |

Using the values of TABLE 1, the common floating gate is programmed by avalanche hot-hole injection in the nFET (writing "1") and erased by avalanche hot-electron injection in the pFET (writing "0"). At standby, WL0=B0L=B0R=0 V. A word-line is selected with WL0=1.5 V which turns on the nFET access transistor. In writing "1", Vds=3.0 V across the floating-gate nFET, thereby causing hot-hole injection in the nFET. In writing "0", Vds=3.0 V across the pFET, thereby causing hot-electron injection in the pFET. In reading the nFET, Vds=1.5 V across both the nFET and the pFET.

Using the values from TABLE 1 for the selected cell (0, 0), a non-selected cell on same word-line as cell (0,) has Vds=0 V across its nFET and pFET in writing "1". That is, a non-selected cell on the same word-line as cell (0, 0) is not disturbed in writing "1". Similarly in writing "0", Vds=0 V across the nFET and pFET of a non-selected cell on the same word-line as cell (0, 0), and hence the non-selected cell is not disturbed either. For a non-selected cell on the same bitline as the selected cell (0, 0), it common node is floating during writing "1" and writing "0". The voltage difference between the bitline B0L and the bitline B0R is divided between the nFET and the pFET. The net result is that Vds across either the nFET or the pFET is not large enough to cause hot-carrier injection. That is, a non-selected cell on the same word-line as the selected cell (0, 0), or on the same bit-line as the selected cell (0, 0), is not disturbed by the operation of the selected cell (0, 0).

Thus, the cell 100 and array 200 can provide for a silicon-on-insulator (SOI) EEPROM chip with both an EEPRPM array and peripheral logic circuits built on same SOI substrate, an EEPROM chip with EEPROM array built on thin polycrystalline silicon films on insulator and peripheral logic circuits built on bulk silicon substrate, and a bulk silicon EEPROM chip with both EEPROM array and peripheral logic circuits built on same bulk silicon substrate.

Figure 4A:
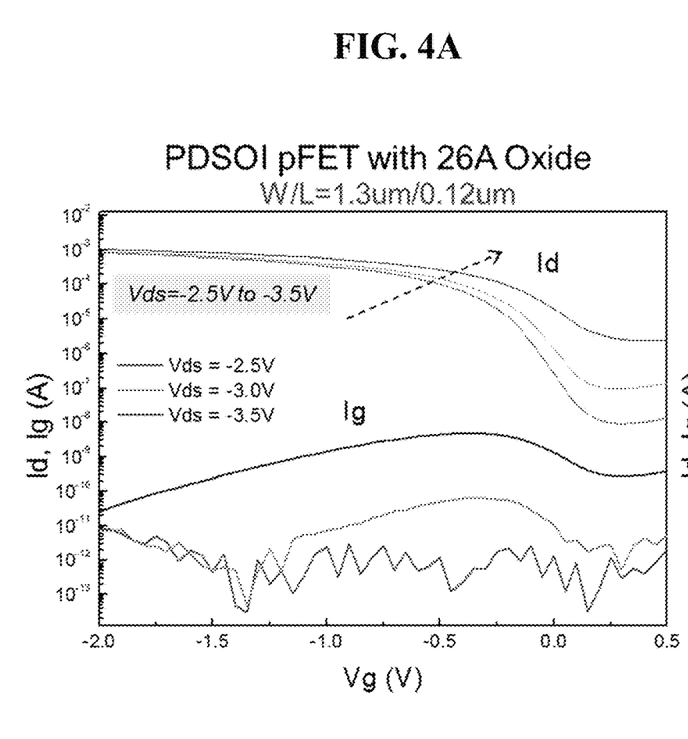
FIG. 4A-4B exemplarily depict experimental data with different dielectric/oxide materials.
Figure 4B:
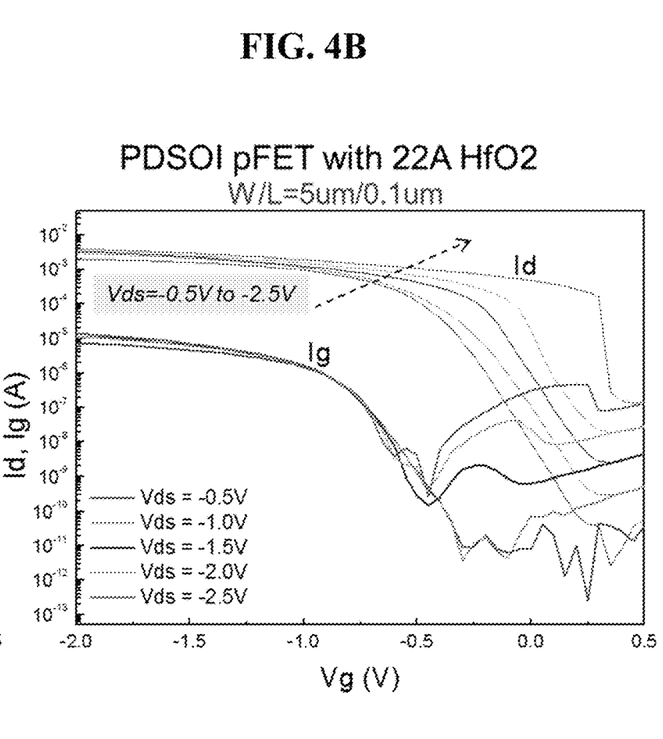

FIGS. 4A-B exemplarily depict experimental values of materials and the efficiency of the hot-electron injection in pFET having $HfO_2$ as gate insulator. As depicted, in FIG. 4A, with an $SiO_2$ gate insulator, there is a negligible avalanche hot-electron injection at Vds<2.5 V. In contrast, in FIG. 4B, with $HfO_2$ as a gate insulator, there is an appreciable avalanche hot-electron injection starting at Vds>1.5 V. Further, for programming with $1E12/cm^2$ electron injection, the SOI pFET with $HfO_2$ gate insulator can be programmed in less than 10 ns at Vds=2.5 V.

Figure 5A:
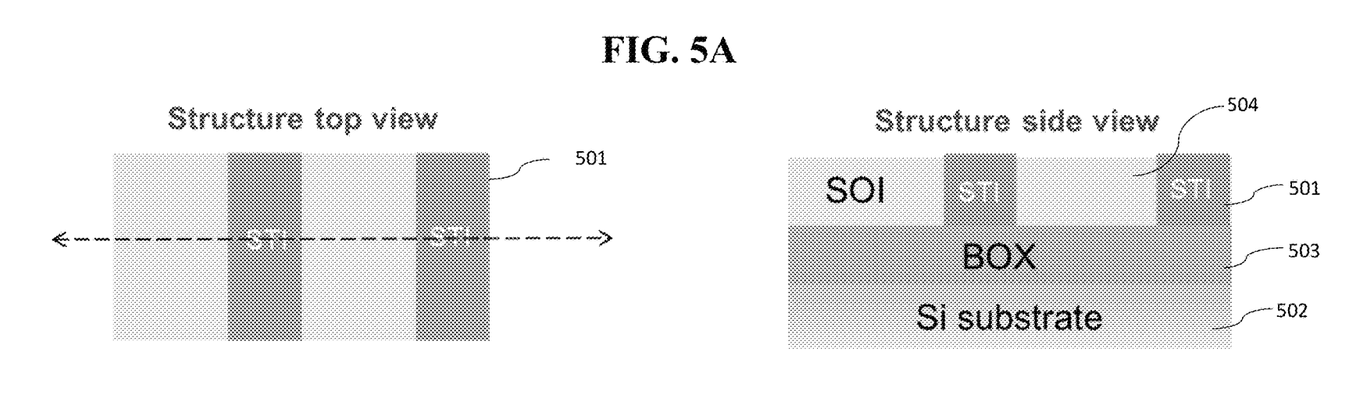
FIG. 5A-5E exemplarily depict a method of manufacture of the parallel-connected merged-floating-gate nFET-pFET EEPROM cell 100.
Figure 5B:
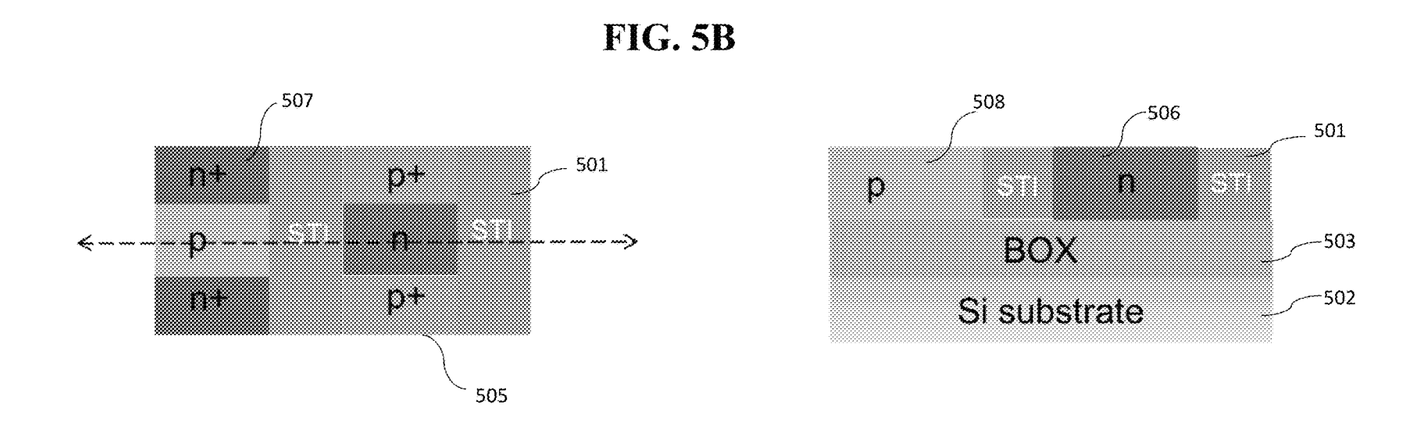
Figure 5C:
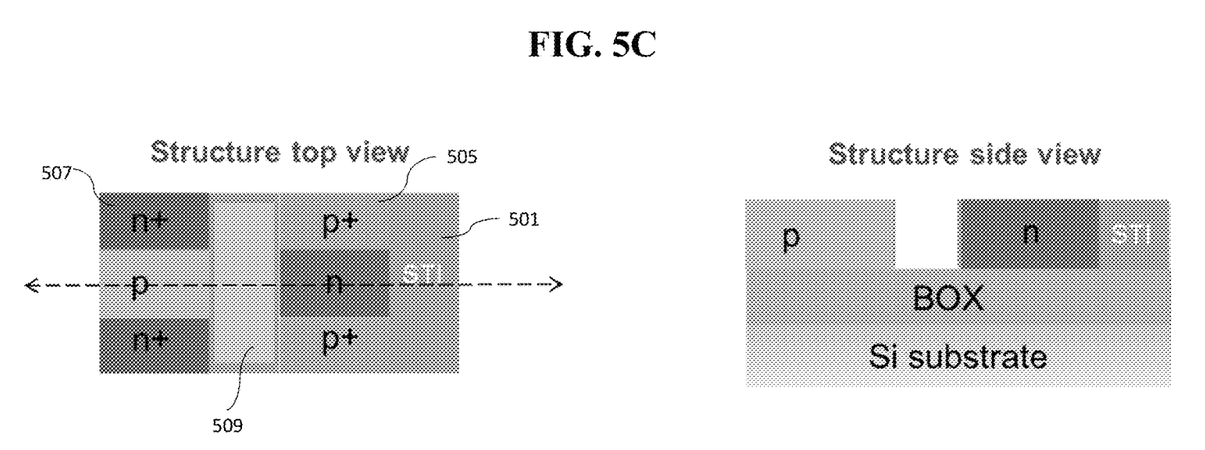
Figure 5D:
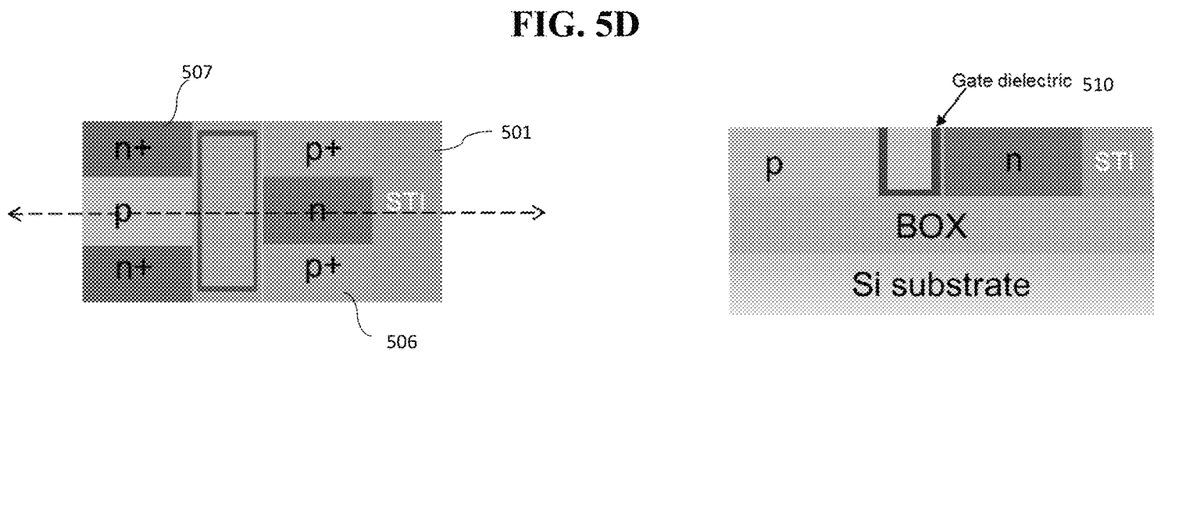
Figure 5E:
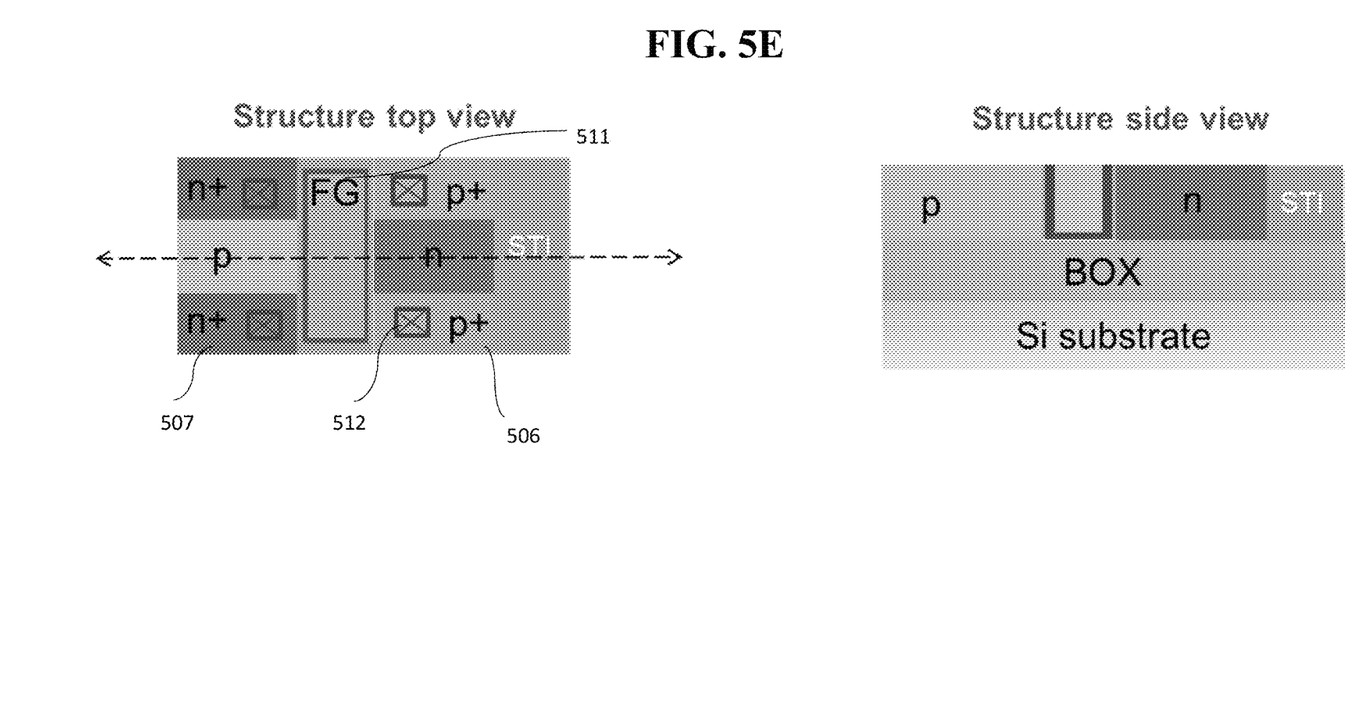

FIGS. 5A-5E exemplarily depict a method of manufacture of the cell 100 according to an embodiment of the invention. As depicted in FIG. 5A, a silicon on insulator (SOI) substrate 5002 is provided, followed by shallow trench isolation (STI) 501 formation for device isolation (e.g., photolithography, etch, oxide deposition, planarization). In FIG. 5B, the nFET (n+/p/n+) 507 and pFET (p+/n/p+) 506 are formed with photolithography and ion implantation. In FIG. 5C, the STI 501 is selectively removed by photolithography and etching to thereafter be filled oxide. In FIG. 5D, a gate dielectric 510 and poly-Si is deposited to form the floating gate 511. In FIG. 5E, dielectric deposition is continued and contacts vias are formed to n+ S/D (source/drain) of nFET and p+ pFET, and metallization is performed.

Thereby, the invention described herein can provide an improvement in efficiency of avalanche hot-hole injection in an nFET, an improvement in hot-carrier injection efficiency by reducing the energy barrier for injection, efficient avalanche hot-electron injection in a pFET by using $Si_3N_4$, $Y_2O_3$, $ZrO_2$, or $HfO_2$ for gate dielectric, and efficient avalanche hot-hole injection in an nFET by using $Si_3N_4$, $Y_2O_3$, $ZrO_2$, or $HfO_2$ for gate dielectric.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Further, Applicant's intent is to encompass the equivalents of all claim elements, and no amendment to any claim of the present application should be construed as a disclaimer of any interest in or right to an equivalent of any element or feature of the amended claim.

What is claimed is:

1. A shared floating gate device, the device comprising:
an nFET;

a pFET comprising a different material than that of the nFET; and a floating gate.

2. The device of claim 1, wherein the nFET and the pFET share the floating gate to form an electrically erasable and programmable non-volatile memory device.

3. The device of claim 1, wherein the nFET includes an nFET gate dielectric,
wherein the pFET includes a pFET gate dielectric, and
wherein the pFET gate dielectric comprises different materials.

4. The device of claim 3, wherein the different materials are selected so that a difference of energy barriers for a hot-carrier injection formed by the nFET gate dielectric and the pFET gate dielectric is 1 eV or less.

5. The device of claim 1, wherein the nFET comprises one of:
$Y_2O_3$;
$ZrO_2$; and
$HfO_2$.

6. The device of claim 1, wherein the pFET comprises one of:
$Si_3N_4$;
$Y_2O_3$;
$ZrO_2$; and
$HfO_2$.

7. An electrically erasable programmable read-only memory (EEPROM) cell, the cell comprising:
an nFET including a source;
a pFET including a drain and comprising a different material than that of the nFET;
a floating gate; and
an nFET access transistor including a drain connected to the source of the nFET and the drain of the pFET.

8. The cell of claim 7, wherein the nFET and the pFET share the floating gate to form an electrically programmable and erasable non-volatile memory device.

9. The cell of claim 7, wherein the nFET includes an nFET gate dielectric,
wherein the pFET includes a pFET gate dielectric, and
wherein the pFET gate dielectric comprises different materials.

10. The cell of claim 9, wherein the different materials are selected so that a difference of energy barriers for a hot-carrier injection formed by the nFET gate dielectric and pFET gate dielectric is 1 eV or less.

11. The cell of claim 7, wherein the nFET comprises one of:
$Y_2O_3$;
$ZrO_2$; and
$HfO_2$.

12. The cell of claim 7, wherein the pFET comprises one of:
$Si_3N_4$;
$Y_2O_3$;
$ZrO_2$; and
$HfO_2$.

13. An array structure, comprising:
a plurality of cells, each cell including:
an nFET including a source;
a pFET including a drain and comprising a different material than that of the nFET;
a floating gate; and
an nFET access transistor including a drain connected to the source of the nFET and the drain of the pFET.

14. The array structure of claim 13, further comprising one nFET access transistor per word-line.

15. The array structure of claim 13, further comprising one bit-line per pFET access transistor.

16. The array structure of claim 13, further comprising word-line and two bit-lines per each cell, said word-line being connected to the gate of the access transistor, one of said bit-lines being connected to the source of the pFET and the other one of said bit-lines being connected to the drain of nFET.

17. The array structure of claim 13, further comprising peripheral logic circuits,
wherein the plurality of cells and the peripheral logic circuits are built on a same substrate.

18. The array structure of claim 13, further comprising peripheral logic circuits,
wherein the plurality of cells is built on a polycrystalline silicon film-on-insulator and the peripheral logic circuits are built on a bulk silicon substrate.

19. The array structure of claim 13, further comprising peripheral logic circuits,
wherein the plurality of cells and the peripheral logic circuits are built on a same bulk silicon substrate.

* * * * *